US006807218B1

(12) United States Patent
Greenwood et al.

(10) Patent No.: US 6,807,218 B1
(45) Date of Patent: Oct. 19, 2004

(54) LASER MODULE AND OPTICAL SUBASSEMBLY

(75) Inventors: Jonathon Greenwood, Phoenix, AZ (US); Robert Darveaux, Higley, AZ (US); Jicheng Yang, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 43 days.

(21) Appl. No.: 10/144,905

(22) Filed: May 13, 2002

(51) Int. Cl.[7] .............................. H01S 3/04; H01S 5/00; H01S 3/08; H01S 3/00
(52) U.S. Cl. .................... 372/107; 372/36; 372/50; 372/99; 372/109; 372/34
(58) Field of Search ......................... 372/36, 50, 99, 372/107, 109, 34; 257/712, 717

(56) References Cited

U.S. PATENT DOCUMENTS

| | | | |
|---|---|---|---|
| 4,733,067 A | 3/1988 | Oinoue et al. | 250/216 |
| 4,854,659 A | 8/1989 | Hamerslag et al. | 350/96.15 |
| 4,983,009 A | 1/1991 | Musk | 350/96.18 |
| 5,327,443 A | 7/1994 | Tanaka et al. | 372/36 |
| 5,367,530 A | 11/1994 | Noishiki et al. | 372/43 |
| 5,544,268 A | 8/1996 | Bischel et al. | 385/4 |
| 5,577,142 A | 11/1996 | Mueller-Fiedler et al. | 385/47 |
| 5,647,036 A | 7/1997 | Deacon et al. | 385/27 |
| 5,664,032 A | 9/1997 | Bischel et al. | 385/4 |
| 5,668,823 A | 9/1997 | Harrison et al. | 372/50 |
| 5,724,463 A | 3/1998 | Deacon et al. | 385/27 |
| 5,835,458 A | 11/1998 | Bischel et al. | 369/44.12 |
| 5,907,571 A | 5/1999 | Ogino et al. | 372/43 |
| 5,911,018 A | 6/1999 | Bischel et al. | 385/16 |
| 5,912,997 A | 6/1999 | Bischel et al. | 385/15 |
| 5,978,524 A | 11/1999 | Bischel et al. | 385/4 |
| 6,027,255 A | 2/2000 | Joo et al. | 385/88 |
| 6,078,704 A | 6/2000 | Bischel et al. | 385/4 |
| 6,118,908 A | 9/2000 | Bischel et al. | 385/14 |
| 6,141,465 A | 10/2000 | Bischel et al. | 385/4 |
| 6,167,169 A | 12/2000 | Brinkman et al. | 385/4 |
| 6,264,377 B1 | 7/2001 | Mitsuda et al. | 385/88 |
| 6,267,515 B1 | 7/2001 | Okuda et al. | 385/88 |
| 6,307,197 B1 | 10/2001 | Krug et al. | 250/227.24 |

FOREIGN PATENT DOCUMENTS

JP 6-151951 5/1994 ............ H01L/31/12

OTHER PUBLICATIONS

U.S. patent application Publication, US 2001/0033722 A1, "Optoelectronic Module", Okada et al., Oct. 25, 2001.

*Primary Examiner*—Don Wong
*Assistant Examiner*—Armando Rodriguez
(74) *Attorney, Agent, or Firm*—Gunnison, McKay & Hodgson, L.L.P.; Serge J. Hodgson

(57) ABSTRACT

A laser module includes an alignment plate having a template plate having a laser diode aperture and a photodiode aperture. A weld plate and a reflector are coupled to the template plate. The structure further includes a heat sink coupled to the alignment plate. A photodiode subassembly is mounted within the photodiode aperture and to the heat sink. Further, a laser diode subassembly is mounted within the laser diode aperture and to the heat sink. In the above manner, the photodiode subassembly, laser diode subassembly and reflected are precisely aligned.

29 Claims, 14 Drawing Sheets ns. However, 20 FIG. 4 in accordance with one embodiment of the present
LASER MODULE AND OPTICAL SUBASSEMBLY

BACKGROUND OF THE INVENTION

1. Field of the Invention

The present invention relates generally to the packaging of electronic components. More particularly, the present invention relates to a laser module and optical subassembly and method of fabricating the same.

2. Description of the Related Art

Laser diodes, e.g., semiconductor lasers, were used in laser modules. These laser modules were used in a wide variety of applications such as in high-performance optical networks.

Conventionally, the power output from the laser diode had to fall within fairly broad limits. Variations in the power output from laser diode to laser diode was acceptable as long as the power output fell within the broad limits. However, newer applications required the power output of each individual laser diode to fall within tight tolerance limits.

As is well known to those of skill in the art, a laser diode emitted light from both a front facet and a back facet. Typically, most of the power output from the laser diode was from the front facet, e.g., 98% or greater. The light from the front faucet was coupled to an optical fiber for transmission.

Conversely, only a small amount of the power output from the laser diode was from the back facet, e.g., 2% or less. However, the power output from the back facet directly varied with the power output from the front facet. Thus, by monitoring the light from the back facet, the power output from the front facet could also be monitored. The light from the back facet was monitored by a photodiode.

To allow the photodiode to monitor the light from the back facet accurately and repeatably, the photodiode and the laser diode had to be precisely aligned. In addition, heat generated by the laser diode and the photodiode had to be efficiently removed to prevent overheating and defective operation of the laser diode and the photodiode. Further, it was important that this alignment and cooling was achieved at a low cost.

SUMMARY OF THE INVENTION

In accordance with one embodiment of the present invention, a laser module includes an alignment plate having a template plate having a laser diode aperture and a photodiode aperture. A weld plate and a reflector are coupled to the template plate. The laser module further includes a heat sink coupled to the alignment plate. A photodiode subassembly is mounted within the photodiode aperture and to the heat sink. Further, a laser diode subassembly is mounted within the laser diode aperture and to the heat sink.

By mounting the photodiode subassembly and the laser diode subassembly within the laser diode aperture and the photodiode aperture, respectively, the photodiode subassembly and the laser diode subassembly are inherently aligned to one another and also to the reflector.

Further, by mounting the photodiode subassembly and the laser diode subassembly directly to the heat sink, heat transfer efficiency from the photodiode subassembly and the laser diode subassembly to the heat sink is improved compared to having the heat conducted additionally through the alignment plate. This insures that a photodiode of the photodiode subassembly and a laser diode of the laser diode subassembly are not overheated.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
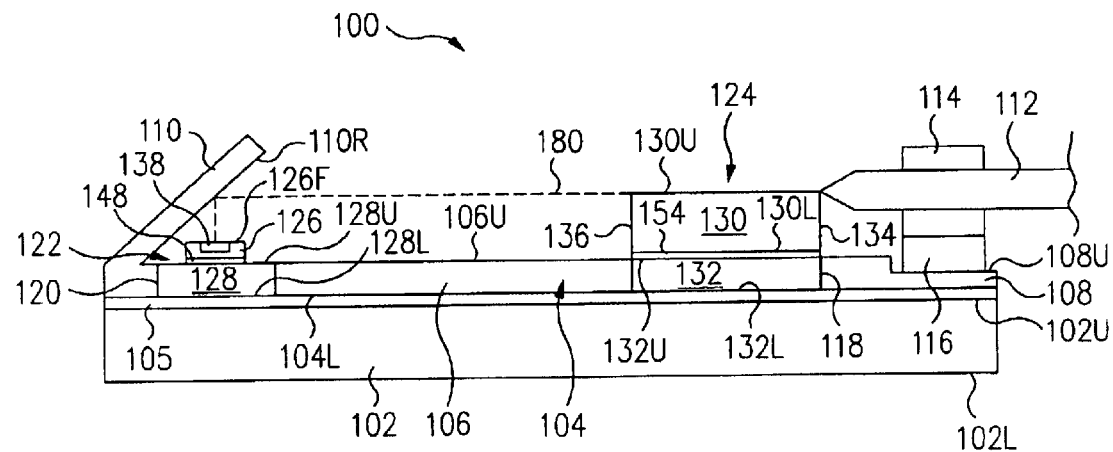
FIG. 1 is a cross-sectional view of an optical subassembly in accordance with one embodiment of the present invention.

FIG. 1 is a cross-sectional view of an optical subassembly 100 in accordance with one embodiment of the present invention. Referring now to FIG. 1, optical subassembly 100 includes a heat sink 102, sometimes called a base or optical bench. Illustratively, heat sink 102 includes a material having a high thermal conductivity, e.g., copper or a copper containing material such as copper tungsten alloy. However, in an alternative embodiment, heat sink 102 is a thermoelectric cooler.

Heat sink 102 includes an upper, e.g., first, surface 102U and a lower, e.g., second, surface 102L. Mounted to upper surface 102U of heat sink 102 is a reflector and alignment plate 104, hereinafter alignment plate 104. Illustratively, alignment plate 104 is mounted to heat sink 102 with solder 105 although other mounting techniques such as the use of adhesive and/or mechanical fasteners are used in other embodiments.

Figure 2:
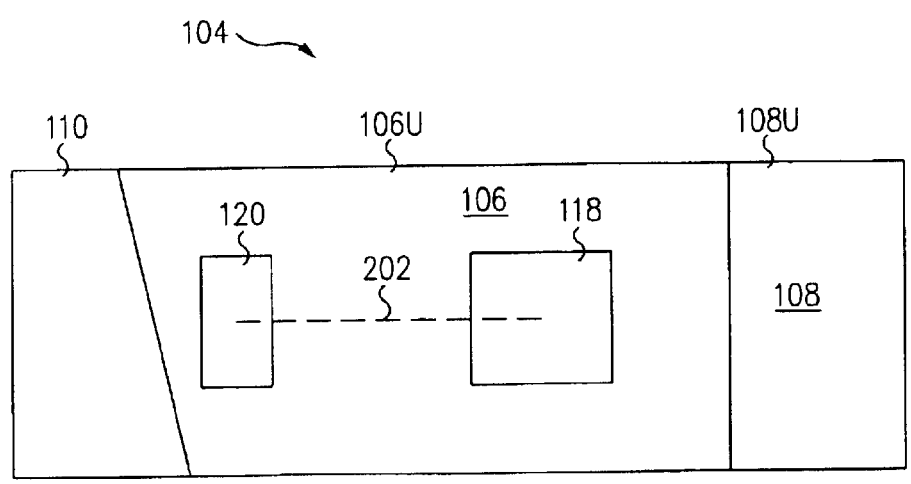
FIG. 2 is a top plan view of an alignment plate of the optical subassembly of FIG. 1 in accordance with one embodiment of the present invention.

FIG. 2 is a top plan view of alignment plate 104 of optical subassembly 100 of FIG. 1 in accordance with one embodiment of the present invention. Referring now to FIGS. 1 and 2 together, alignment plate 104 includes a template plate 106, a weld plate 108 and a reflector 110. In one embodiment, alignment plate 104 is integral, i.e., template plate 106, weld plate 108 and reflector 110 are parts of a single piece and are not separate pieces connected together. However, in an alternative embodiment, template plate 106, weld plate 108 and/or reflector 110 are separate pieces connected together.

In this embodiment, template plate 106 and weld plate 108 include a lower, e.g., first, surface 104L nmounted to heat sink 102. An upper, e.g., second, surface 108U of weld plate 108 is below an upper, e.g., second, surface 106U of template plate 106 such that weld plate 108 is thinner than template plate 106. However, in an alternative embodiment, weld plate 108 is the same or greater thickness than template plate 106.

An optical fiber 112, e.g., a lens or wedge shaped fiber, is supported in a ferrule 114. Ferrule 114 and thus optical fiber 112 are mounted to upper surface 108U of weld plate 108 by a weld clip 116. Weld clip 116 is welded to weld plate 108 but is mounted using other techniques in other embodiments.

Template plate 106 includes a laser diode aperture 118 and a photodiode aperture 120. Laser diode aperture 118 and photodiode aperture 120 extend through template plate 106 from upper surface 106U to lower surface 104L.

A photodiode subassembly 122 and a laser diode subassembly 124 are mounted within laser diode aperture 118 and photodiode aperture 120, respectively. More particularly, photodiode subassembly 122 includes a photodiode 126 and a photodiode substrate 128, sometimes called a photodiode submount. Further, laser diode subassembly 124 includes a laser diode 130 and a laser diode substrate 132, sometimes called a laser diode submount.

Lower, e.g., first, surfaces 128L, 132L of photodiode substrate 128, laser diode substrate 132, respectively, are mounted to upper surface 102U of heat sink 102, e.g., with solder 105, sometimes called a solder preform. Mounted to upper, e.g., second, surfaces 128U, 132U of photodiode substrate 128, laser diode substrate 132 are photodiode 126 and laser diode 130, respectively.

In one embodiment, photodiode substrate 128 and laser diode substrate 132 are formed of a material having a high thermal conductivity. For example, photodiode substrate 128 and laser diode substrate 132 are aluminum nitride (AlN), aluminum oxide (Al2O3), beryllium oxide (BeO) although other materials having a large heat transfer coefficient are used in other embodiments.

During use, photodiode 126 and laser diode 130 generate heat. This heat is conducted directly to heat sink 102 through photodiode substrate 128, laser diode substrate 132 and solder 105. More particularly, by forming alignment plate 104 with laser diode aperture 118 and photodiode aperture 120, heat transfer efficiency from photodiode 126 and laser diode 130 to heat sink 102 is improved compared to having the heat conducted additionally through alignment plate 104. This insures that photodiode 126 and laser diode 130 are not overheated.

Further, during use, laser diode 130 emits light. Generally, laser diode 130 is a light source. To illustrate, laser diode 130 is a semiconductor laser, a vertical cavity surface emitting laser (VCSEL), a light emitting diode (LED), an edge emitting LED although other light emitting devices are used in other embodiments.

Laser diode 130 includes a front, e.g., first, facet 134 and a rear, e.g., second, facet 136. Optical fiber 112 is aligned with and receives light from front facet 134.

As discussed further below, photodiode 126 receives light from laser diode 130. Generally, photodiode 126 is a light detector. More particularly, photodiode 126 includes a front, e.g., first, surface 126F including an active area 138, which is responsive to electromagnetic radiation, i.e., light.

Reflector 110 includes a reflective surface 110R. During use, light 180 emanating from rear facet 136 of laser diode 130 strikes reflective surface 110R. Light 180 is reflected down onto active area 138 of photodiode 126. Active area 138 responds to light 180 as those of skill in the art will understand. In one embodiment, by monitoring the light output from rear facet 136 of laser diode 130 with photodiode 126 as discussed above, the power input to laser diode 130 is continuously adjusted to provide a constant power output from front facet 134.

To insure that light 180 from rear facet 136 strikes active area 138 of photodiode 126, laser diode 130, reflector 110 and photodiode 126 are aligned to within tight tolerance.

Further, to insure that the power output, i.e., light, from front facet 134 from each individual optical subassembly 100 is repeatable and within tight tolerance, laser diode 130, reflector 110 and photodiode 126 are repeatably aligned to within tight tolerance. Specifically, if laser diode 130, reflector 110 and photodiode 126 have a first alignment in a first optical subassembly and a second alignment in a second optical subassembly, variation in performance of the first and second optical subassemblies may be observed. This variation is unacceptable depending upon the particular application.

Figure 3:
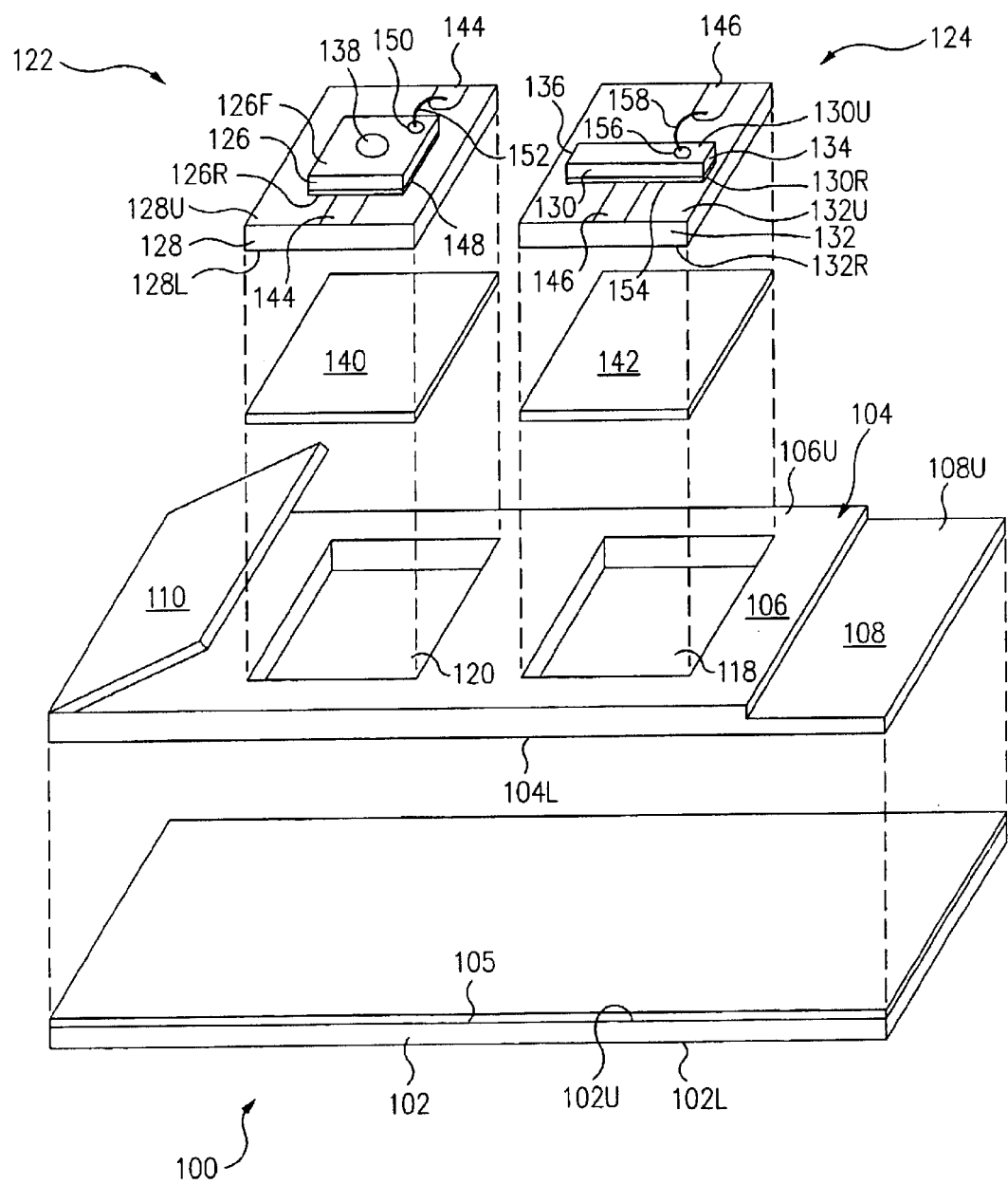
FIG. 3 is an exploded perspective view of the optical subassembly of FIG. 1 in accordance with one embodiment of the present invention.

FIG. 3 is an exploded perspective view of optical subassembly 100 of FIG. 1 in accordance with one embodiment of the present invention. In FIG. 3., optical fiber 112, ferrule 114 and weld clip 116 are not illustrated.

Referring now to FIGS. 1, 2 and 3 together, by forming optical subassembly 100 with alignment plate 104, laser diode 130, reflector 110 and photodiode 126 are aligned to within tight tolerance. Specifically, reflector 110 inherently has a tight tolerance to laser diode aperture 118 and photodiode aperture 120 since these features are all part of alignment plate 104.

Further, by mounting photodiode subassembly 122 and laser diode subassembly 124 within laser diode aperture 118 and photodiode aperture 120, respectively, photodiode subassembly 122 and laser diode subassembly 124 are inherently aligned to one another and also to reflector 110. Thus, laser diode 130, reflector 110 and photodiode 126 are aligned to within tight tolerance in an individual optical subassembly 100, and repeatedly aligned from optical subassembly 100 to optical subassembly 100.

In one embodiment, referring now to FIG. 3, alignment plate 104 is mounted to heat sink 102 by solder 105. Further, in one embodiment, photodiode subassembly 122 and laser diode subassembly 124 are mounted using solders 140, 142 respectively, sometimes called solder preforms.

Photodiode subassembly 122 and laser diode subassembly 124 are prevented from being misaligned during melting of solders 140, 142, i.e., during mounting, since photodiode subassembly 122 and laser diode subassembly 124 are located within photodiode aperture 120 and laser diode aperture 118, respectively. Although use of solders 140, 142 is set forth above, in an alternative embodiment, solders 140, 142 are not used and solder 105 mounts photodiode subassembly 122 and laser diode subassembly 124.

In one embodiment, electrically conductive traces 144 and 146 are formed on upper surface 128U of photodiode substrate 128 and on upper surface 132U of laser diode substrate 132, respectively. Illustratively, a rear, e.g., second, surface 126R of photodiode 126 is mounted to upper surface 128U of photodiode substrate 128 with adhesive 148, e.g., electrically conductive adhesive, solder or a metallic alloy such as gold-tin (AuSn) alloy. More specifically, rear surface 126R of photodiode 126 is electrically connected to at least one trace 144. However, in an alternative embodiment, rear surface 126R of photodiode 126 is not electrically connected to any of traces 144.

A terminal 150 on front surface 126F of photodiode 126 is electrically connected to a trace 144 by a bond wire 152. Although only a single terminal 150 is illustrate, in light of this disclosure, those of skill in the art will understand that photodiode 126 can include more than one terminal 150 depending upon the particular input/output requirements of photodiode 126.

Further, a lower, e.g., first, surface 130L of laser diode 130 is mounted to upper surface 132U of laser diode substrate 132 with adhesive 154, e.g., electrically conductive adhesive, solder or a metallic alloy such as gold-tin (AuSn) alloy.

More specifically, lower surface 130L of laser diode 130 is electrically connected to at least one trace 146. However, in an alternative embodiment, lower surface 130L of laser diode 130 is not electrically connected to any of traces 146.

A terminal 156 on an upper, e.g., second, surface 130U of laser diode 130 is electrically connected to a trace 146 by a bond wire 158. Although only a single terminal 156 is illustrate, in light of this disclosure, those of skill in the art will understand that laser diode 130 can include more than one terminal 156 depending upon the particular input/output requirements of laser diode 130.

Traces 144, 146 are electrically connected to leads of a laser module formed with optical subassembly 100, for example, with bond wires.

Referring again to FIGS. 1 and 2 together, to prevent light 180 from being reflected back from photodiode 126 to rear facet 136 of laser diode 130, reflector 110 is angled with respect to a line 202 from photodiode 126 to laser diode 130. In this manner, light 180 from rear facet 136 is reflected by reflector 110 to photodiode 126 and not vice versa.

Figure 4:
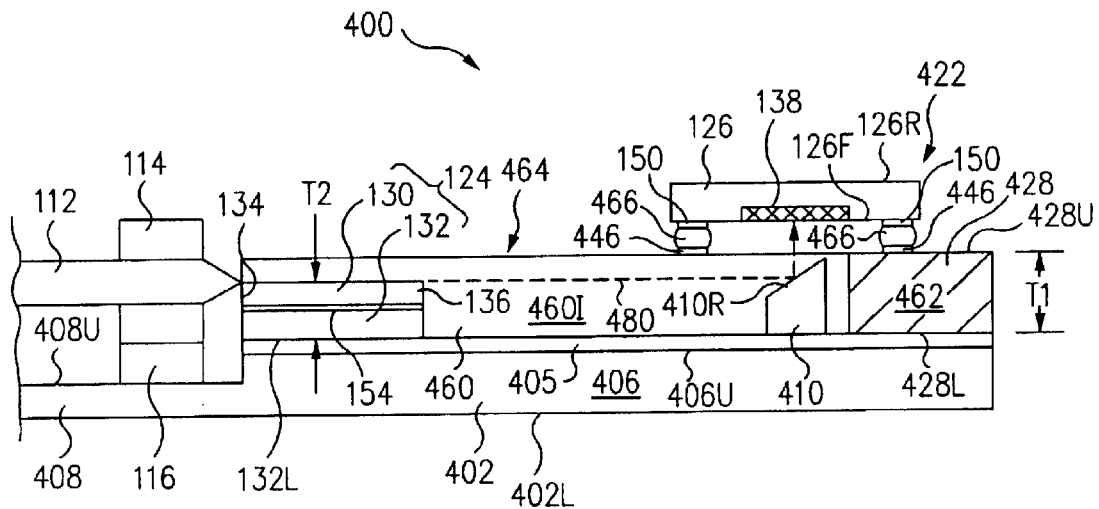
FIG. 4 is a cross-sectional view of an optical subassembly in accordance with another embodiment of the present invention.
Figure 5:
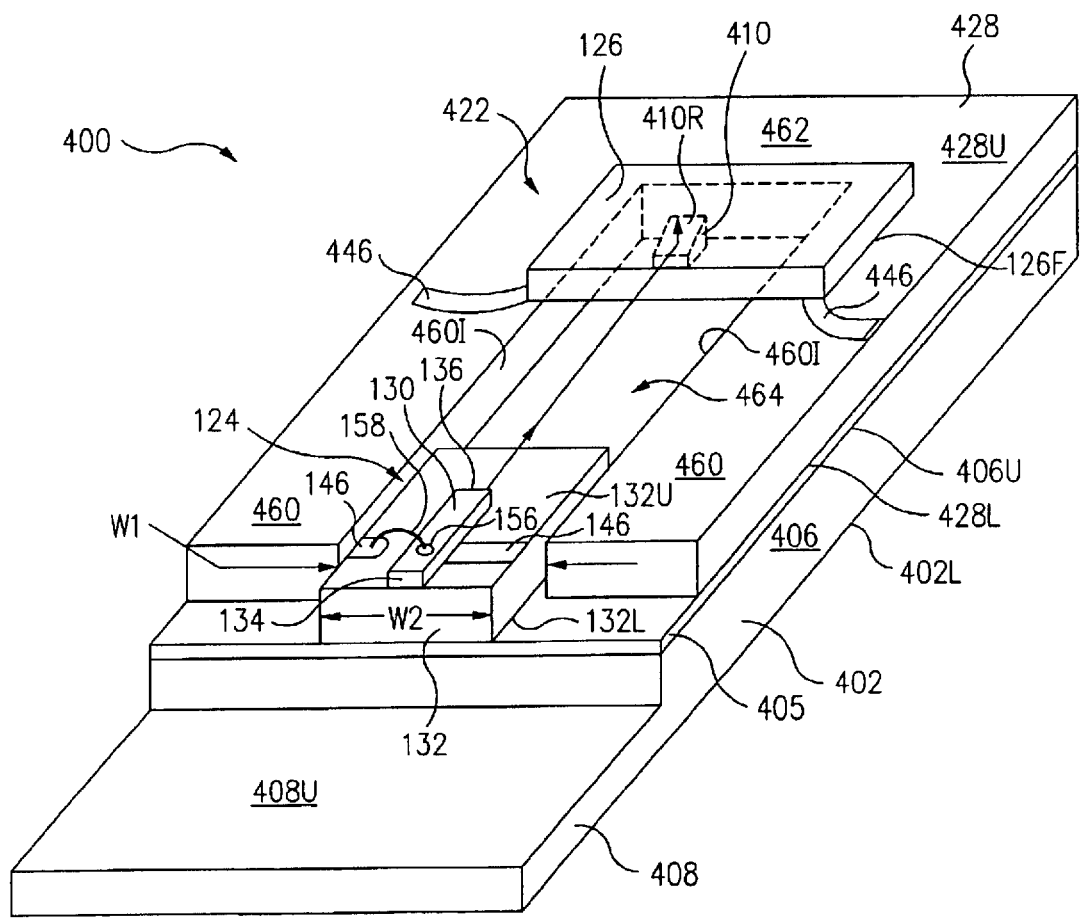
FIG. 5 is a perspective view of the optical subassembly of FIG. 4 in accordance with one embodiment of the present invention.

FIG. 4 is a cross-sectional view of an optical subassembly 400 in accordance with another embodiment of the present invention. FIG. 5 is a perspective view of optical subassembly 400 of FIG. 4 in accordance with one embodiment of the present invention. Optical subassembly 400 of FIGS. 4 and 5 is similar in various aspects to optical subassembly 100 of FIGS. 1 and 3. Accordingly, similar elements are labeled with similar reference numbers and the discussion above regarding these similar elements is incorporated herein as applied to optical subassembly 400.

Referring now to FIGS. 4 and 5, optical subassembly 400 includes a heat sink 402, sometimes called a base or optical bench. Illustratively, heat sink 402 includes a material having a high thermal conductivity, e.g., copper or a copper containing material such as copper tungsten alloy (CuW). However, in an alternative embodiment, heat sink 402 is a thermoelectric cooler.

Heat sink 402 includes a template plate 406, and a weld plate 408. In one embodiment, heat sink 402 is integral, i.e., template plate 406 and weld plate 408 are parts of a single piece and are not separate pieces connected together. However, in an alternative embodiment, template plate 406 and/or weld plate 408 are separate pieces connected together.

In this embodiment, template plate 406 and weld plate 408 include a lower, e.g., first, surface 402L. An upper, e.g., second, surface 408U of weld plate 408 is below an upper, e.g., second, surface 406U of template plate 406 such that weld plate 408 is thinner than template plate 406. However, in an alternative embodiment, weld plate 408 is the same or greater thickness than template plate 406.

An optical fiber 112 is supported in a ferrule 114. Ferrule 114 and thus optical fiber 112 are mounted to upper surface 408U of weld plate 408 by a weld clip 116. Weld clip 116 is welded to weld plate 408 but is mounted using other techniques in other embodiments. In FIG. 5, optical fiber 112, ferrule 114 and weld clip 116 are not illustrated to avoid detracting from the principals of the invention.

Mounted to upper surface 406U of template plate 406 are a laser diode subassembly 124, a photodiode subassembly 422, and a reflector 410. More particularly, photodiode subassembly 422 includes a photodiode 126 and a photodiode substrate 428, sometimes called a photodiode submount.

Photodiode substrate 428 includes a lower, e.g., first, surface 428L and an upper, e.g., second, surface 428U. Photodiode substrate 428 is a horseshoe shaped member, sometimes called a U-shaped member. More particularly, photodiode substrate 428 includes a pair of spaced apart parallel fingers 460 extending from a main body 462.

Fingers 460 and main body 462 define a slot 464. More particular, inner sides 460I of fingers 460 and an inner side 462I of main body 462 define slot 464.

Laser diode subassembly 124 included a laser diode 130 and a laser diode substrate 132, sometimes called a laser diode submount. Lower surfaces 428L, 132L of photodiode substrate 428, laser diode substrate 132, respectively, are mounted to upper surface 406U of template plate 406, e.g., with solder 405, sometimes called a solder preform. Mounted to upper surfaces 428U, 132U of photodiode substrate 428, laser diode substrate 132 are photodiode 126 and laser diode 130, respectively.

Laser diode subassembly 124 is located within slot 464. To allow laser diode subassembly 124 to fit within Blot 464, a width W1 of slot 464 is slightly greater than a width W2 of laser diode subassembly 124, and, particularly, laser diode substrate 132. However, by forming width W1 of slot 464, i.e., the distance between inner sides 460I of fingers 460, to be only slightly greater than width W2 of laser diode substrate 132, laser diode subassembly 124 is positioned with respect to photodiode substrate 428 to within tight tolerance.

Further, a thickness T1 of photodiode substrate 428, i.e., the distance between upper surface 428U and lower surface 428L, is greater than a thickness T2 of laser diode subassembly 124, i.e., the combined thickness of laser diode 130 and laser diode substrate 132.

Reflector 410 is also located within slot 464 directly below photodiode 126. In accordance with this embodiment, photodiode 126 is flip chip mounted to upper surface 428U of photodiode substrate 428. By flip chip mounting photodiode 126 to photodiode substrate 428, photodiode 126 is positioned with respect to photodiode substrate 42B and thus to laser diode 130 to within tight tolerance.

More particularly, terminals 150, sometimes called bond pads, are on front surface 126F of photodiode 126. Traces 446 are formed on upper surface 428U of photodiode substrate 428. Terminals 150 are physically and electrically connected to traces 446 by electrically conductive flip chip bumps 466, e.g., formed of gold, solder or electrically conductive adhesive.

Reflector 410 includes a reflective surface 410R. During use, light 480 emanating from rear facet 136 of laser diode 130 strikes reflective surface 410R. Light 480 is reflected up onto active area 138 of photodiode 126. Active area 138 responds to light 480 as those of skill in the art will understand. In one embodiment, by monitoring the light output from rear facet 136 of laser diode 130 with photodiode 126 as discussed above, the power input to laser diode 130 is continuously adjusted to provide a constant power output from front facet 134.

In a manner similar to that discussed above with regards to FIGS. 1 and 2 together, to prevent light 480 from being reflected back from photodiode 126 to rear facet 136 of laser diode 130, reflector 410 is angled with respect to a line from photodiode 126 to laser diode 130. Thus, light 480 from rear facet 136 is reflected by reflector 410 to photodiode 126 and not vice versa.

In one embodiment, photodiode substrate 428 and laser diode substrate 132 are formed of a material having a high thermal conductivity. For example, photodiode substrate 428 and laser diode substrate 132 are aluminum nitride (AlN), aluminum oxide (Al2O3), beryllium oxide (BeO) although other materials having a large heat transfer coefficient are used in other embodiments.

During use, photodiode 126 and laser diode 130 generate heat. This heat is conducted directly to heat sink 402 through photodiode substrate 428, laser diode substrate 132 and solder 405. This insures that photodiode 126 and laser diode 130 are not overheated.

Figure 6:
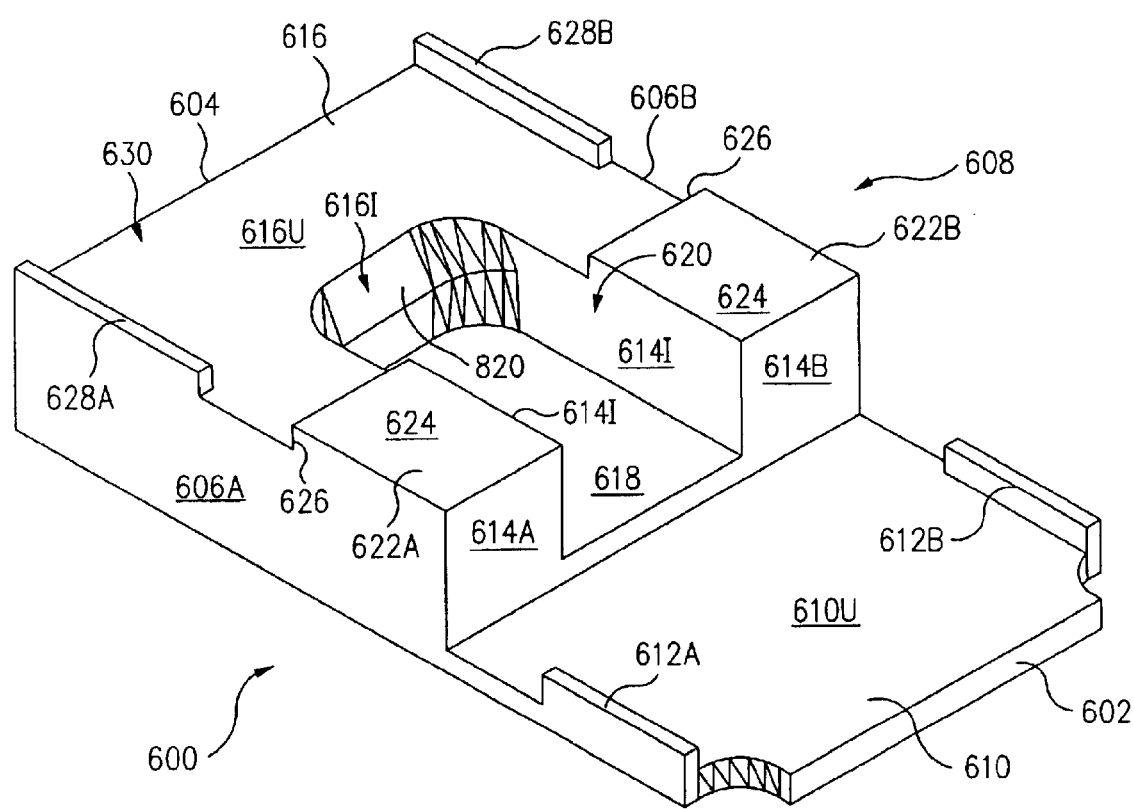
FIGS. 6 and 7 are perspective and top plan views of an optical bench in accordance with one embodiment of the present invention.
Figure 7:
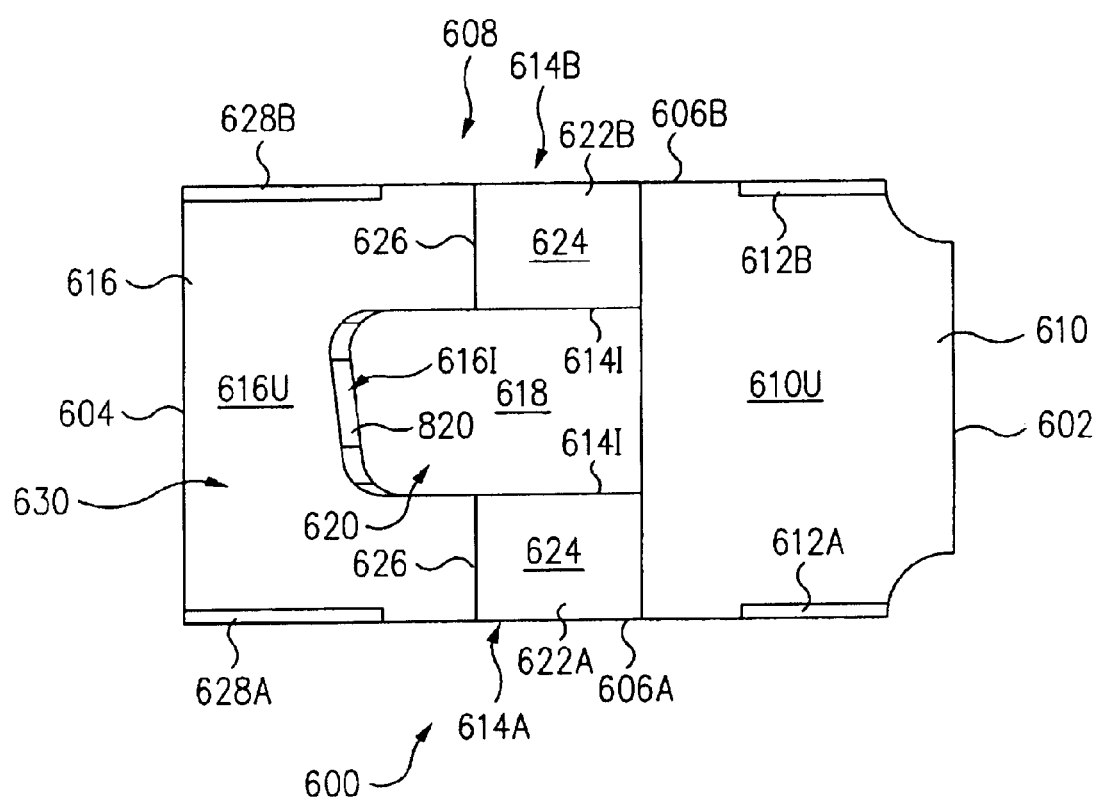

FIGS. 6 and 7 are perspective and top plan views of an optical bench 600 in accordance with one embodiment of the present invention. Referring now to FIGS. 6 and 7 together, optical bench 600 includes a leading side 602, a tailing side 604, and first and second sides 606A, 606B, collectively referred to sides 606. Optical bench 600 is sometimes called a heat sink. In one embodiment, optical bench 600 is formed by machining a single-piece, e.g., of copper or copper tungsten alloy (Cuw).

Optical bench 600 is essentially rectangular as best shown in FIG. 7. More particularly, leading side 602 is parallel to tailing side 604 and sides 606 are parallel to one another. Further, sides 606 are perpendicular to and extend between leading side 602 and tailing side 604.

Optical bench 600 includes a template plate 608 and a weld plate support 610. In one embodiment, optical bench 600 is integral, i.e., template plate 608 and weld plate support 610 are parts of a single piece and are not separate pieces connected together. However, in an alternative embodiment, template plate 608 and/or weld plate support 610 are separate pieces connected together.

In this embodiment, template plate 608 and weld plate support 610 include a lower, e.g., first, surface 600L. Weld plate support 610 includes first and second tabs 612A, 612B formed along first and second sides 606A, 606B, respectively. In accordance with this embodiment, tabs 612A, 612B are rectangular bars but are formed in other shapes in other embodiments.

Tabs 612A, 612B project upwards, e.g., in a first direction, from upper surface 610U of weld plate support 610. Tabs 612A, 612B facilitate alignment and mounting of a weld plate to optical bench 600. Alternatively, weld plate support 610 is used as a weld plate.

Template plate 608 is a horseshoe shaped member, sometimes called a U-shaped member. More particularly, template plate 608 includes a pair of spaced apart parallel fingers 614A, 614B, collectively fingers 614, extending from a main body 616.

Main body 616 extends along and is located at tailing side 604. Fingers 614A, 614B are parallel to, extend along and are at sides 606A, 6062, respectively. Fingers 614 extend from main body 616 away from tailing side 604 and towards leading side 602.

Fingers 614 include inner sides 614I and main body 616 includes an inner side 616I. Template plate 608 lop further includes a laser diode subassembly mounting surface 618, hereinafter referred to as a laser mounting surface 618. Laser mounting surface 618 is contiguous with inner sides 614I of fingers 614 and inner side 616I of main body 616.

Laser mounting surface 618, inner sides 614I of fingers 614 and inner side 616I of main body 616 define a trench 620. Trench 620 facilitates alignment and mounting of a laser diode subassembly to optical bench 600 as discussed below in greater detail in reference to FIG. 8.

Template plate 608 further includes stops 622A, 622B, collectively referred to stops 622. More particularly, stops 622A, 622B are located at the tips of fingers 614A, 614B, respectively. Stated another way, stops 622A, 622B are located at the end of fingers 614A, 614B, respectively, which are nearest leading side 602 and furthest away from tailing side 604. Thus, fingers 614 extend from main body 616 to stops 622.

Main body 616 includes an upper surface 616U. Stops 622 extend above upper surface 616U. More particularly, stops 622 include raised surfaces 624. A plane defined by raised surfaces 624 is above a plane defined by upper surface 616U of main body 616. Stops 622 further include stop surfaces 626 perpendicular to and extending between upper surface 616U of main body 616 and raised surfaces 624.

Template plate 608 further includes first and second tabs 628A, 628B formed along first and second sides 606A, 606B, respectively, of optical bench 600. In accordance with this embodiment, tabs 628A, 628B are rectangular bars but are formed in other shapes in other embodiments.

Tabs 628A, 628B project upwards from upper surface 616U of main body 616. Tabs 628A, 628B in combination with stops 622 define a pocket 630, which facilitates alignment and mounting of a photodiode subassembly to optical bench 600 as discussed below in greater detail in reference to FIG. 8.

Figure 8:
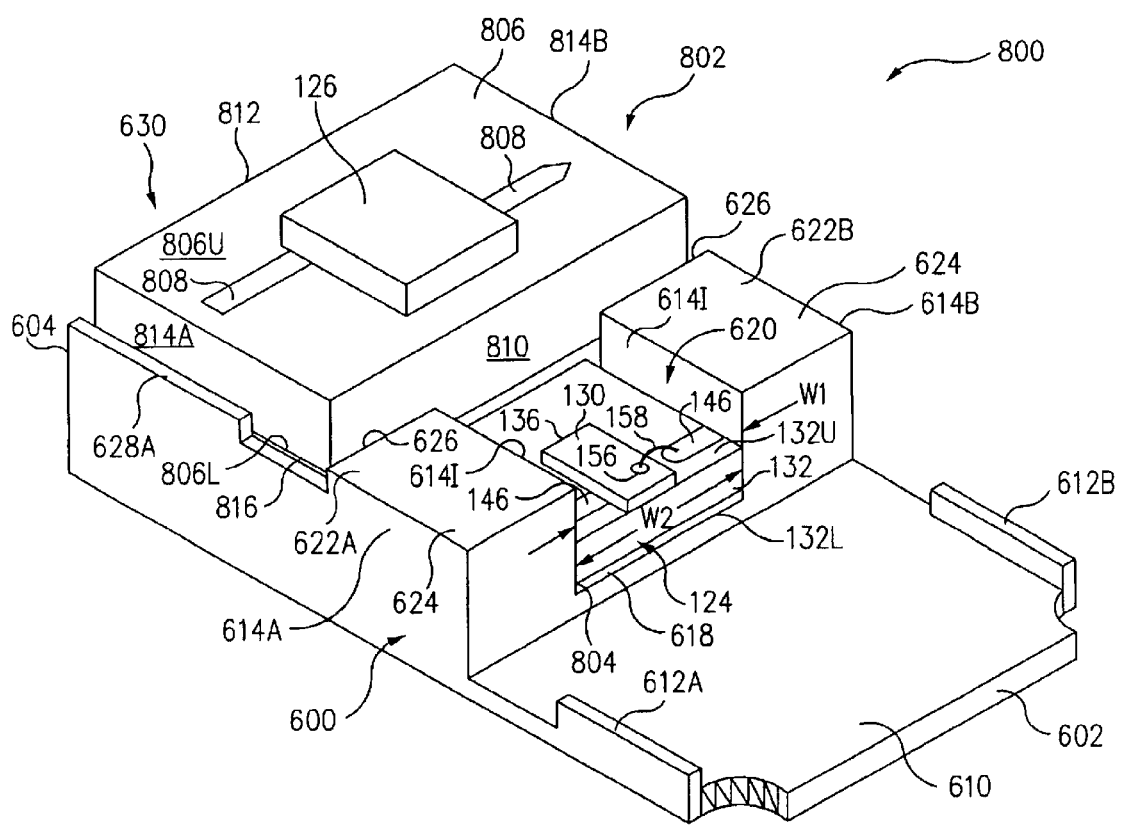
FIG. 8 is a perspective view of an optical subassembly formed with the optical bench of FIG. 6 in accordance with one embodiment of the present invention.
Figure 9:
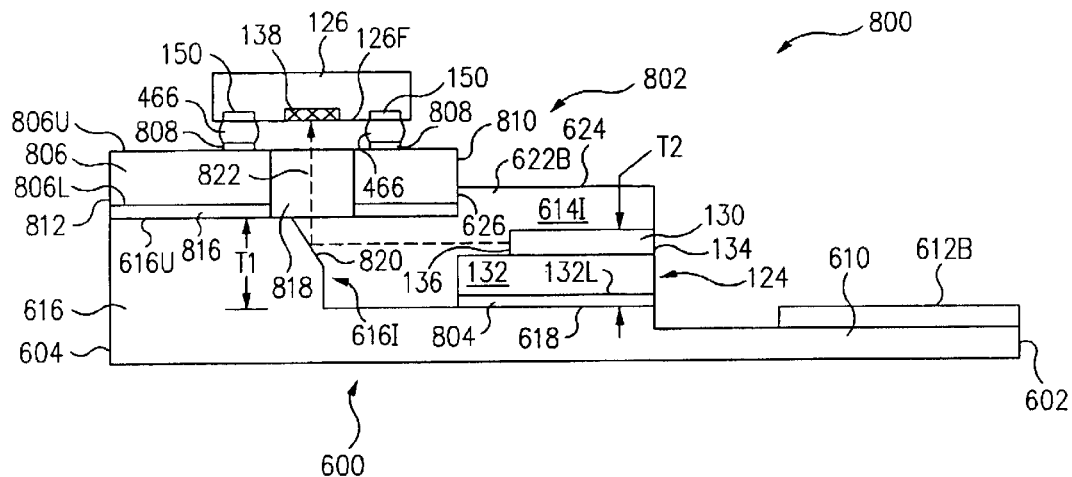
FIG. 9 is a cross-sectional view of the optical subassembly of FIG. 8 in accordance with one embodiment of the present invention.

FIG. 8 is a perspective view of an optical subassembly 800 formed with optical bench 600 of FIG. 6 in accordance with one embodiment of the present invention. FIG. 9 is a cross-sectional view of optical subassembly 800 of FIG. 8 in accordance with one embodiment of the present invention. Optical subassembly 800 of FIGS. 8 and 9 is similar in various aspects to optical subassembly 400 of FIGS. 4 and 5. Accordingly, similar elements are labeled with similar reference numbers and the discussion above regarding these similar elements is incorporated herein as applied to optical subassembly 800.

Referring now to FIGS. 8 and 9 together, optical subassembly 800 includes laser diode subassembly 124 and a photodiode subassembly 802 mounted to optical bench 600. More particular, lower surface 132L of laser diode substrate 132 of laser diode subassembly 124 is mounted to laser mounting surface 618, e.g., with solder 804, sometimes called a solder preform. In this manner, laser diode subassembly 124 is located within trench 620.

To allow laser diode subassembly 124 to fit within trench 620, a width W1 of trench 620 is slightly greater than width W2 of laser diode subassembly 124, and, particularly, laser diode substrate 132. However, by forming width W1 of trench 620, i.e., the distance between inner sides 614I of fingers 614, to be only slightly greater than width W2 of laser diode substrate 132, laser diode subassembly 124 is positioned with respect to optical bench 600 to within tight tolerance.

Further, a thickness T1 of fingers 614 and main body 616, i.e., the distance between upper surface 616U of main body 616 and laser mounting surface 618, is greater than thickness T2 of laser diode subassembly 124.

Photodiode subassembly 802 includes photodiode 126 flip chip mounted to an upper surface 806U of a photodiode substrate 806. By flip chip mounting photodiode 126 to photodiode substrate 806, photodiode 126 is positioned with respect to photodiode substrate 806 to within tight tolerance.

More particularly, traces 808 are formed on upper surface 806U of photodiode substrate 806. Terminals 150 are physically and electrically connected to traces 808 by flip chip bumps 466.

As discussed above in reference to FIGS. 7 and 8, tabs 628A, 628B in combination with stops 622 define a pocket 630. Photodiode substrate 806 is shaped to fit snugly within pocket 630 in a lock and key arrangement.

More particularly, photodiode substrate 806 includes upper surface 806U and a lower surface 806L opposite upper surface 806U. Photodiode substrate 806 further includes a leading side 810, a tailing side 812, and first and second sides 814A, 814B, collectively referred to sides 814. Leading side 810, tailing side 812, and sides 814 are perpendicular to and extend between upper surface 806U and lower surface 806L.

In this embodiment, photodiode substrate 806 is rectangular. More particularly, leading side 810 is parallel to tailing side 812 and sides 814 are parallel to one another. Further, sides 814 are perpendicular to and extend between leading side 810 and tailing side 812.

Lower surface 806L of photodiode substrate 806 is mounted to upper surface 616U of main body 616, for example, with solder 816, sometimes called a solder preform. Photodiode substrate 806 is mounted such that leading side 810 is in abutting contact or directly adjacent stops 622, and more particularly, stop surfaces 626. Further, sides 814A, 814B are in abutting contact or directly adjacent tabs 628A, 628B, respectively.

By mounting photodiode substrate 806 within pocket 630, photodiode substrate 806 and thus photodiode 126 is positioned with respect to optical bench 600 to within tight tolerance. As discussed above, laser diode subassembly 124 and thus laser diode 130 are also positioned with respect to optical bench 600 to within tight tolerance. As a result, photodiode 126 is positioned with respect to laser diode 130 to within tight tolerance.

Photodiode substrate 806 includes a photodiode aperture 818 extending through photodiode substrate 806 from lower surface 806L to upper surface 806U. Photodiode aperture 818 is directly below, e.g., in a second direction, and aligned with active area 138 of photodiode 126. Directly below and aligned with photodiode aperture 818 and active area 138 of photodiode 126 is inner surface 616I of main body 616.

Inner surface 616I, sometimes referred to as a reflector, includes a reflective surface 820. Reflective surface 820 is angled with respect to front surface 126F of photodiode 126. During use, light 822 emanating from rear facet 136 of laser diode 130 strikes reflective surface 820. Light 822 is reflected up onto active area 138 of photodiode 126.

In one embodiment, by monitoring the light output from rear facet 136 of laser diode 130 with photodiode 126 as discussed above, the power input to laser diode 130 is continuously adjusted to provide a constant power output from front facet 134.

In a manner similar to that discussed above with regards to FIGS. 1 and 2 together, to prevent light 822 from being reflected back from photodiode 126 to rear facet 136 of laser diode 130, reflective surface 820 is angled with respect to a line from photodiode 126 to laser diode 130 as shown in FIG. 7. Thus, light 822 from rear facet 136 is reflected by reflective surface 820 to photodiode 126 and not vice versa.

In one embodiment, photodiode substrate 806 and laser diode substrate 132 are formed of a material having a high thermal conductivity. For example, photodiode substrate 806 and laser diode substrate 132 are aluminum nitride (AlN), aluminum oxide (Al2O3), beryllium oxide (BeO) although other materials having a large heat transfer coefficient are used in other embodiments.

During use, photodiode 126 and laser diode 130 generate heat. This heat is conducted directly to optical bench 600 through photodiode substrate 806, laser diode substrate 132 and solders 804, 816, respectively. This insures that photodiode 126 and laser diode 130 are not overheated.

As discussed above, light 822 is reflected by reflective surface 802 of inner surface 616I. However, in alternative embodiment, instead of forming inner surface 616I with reflective surface 820, optical bench 600 includes an additional reflector as discussed below in reference to FIG. 10.

Figure 10:
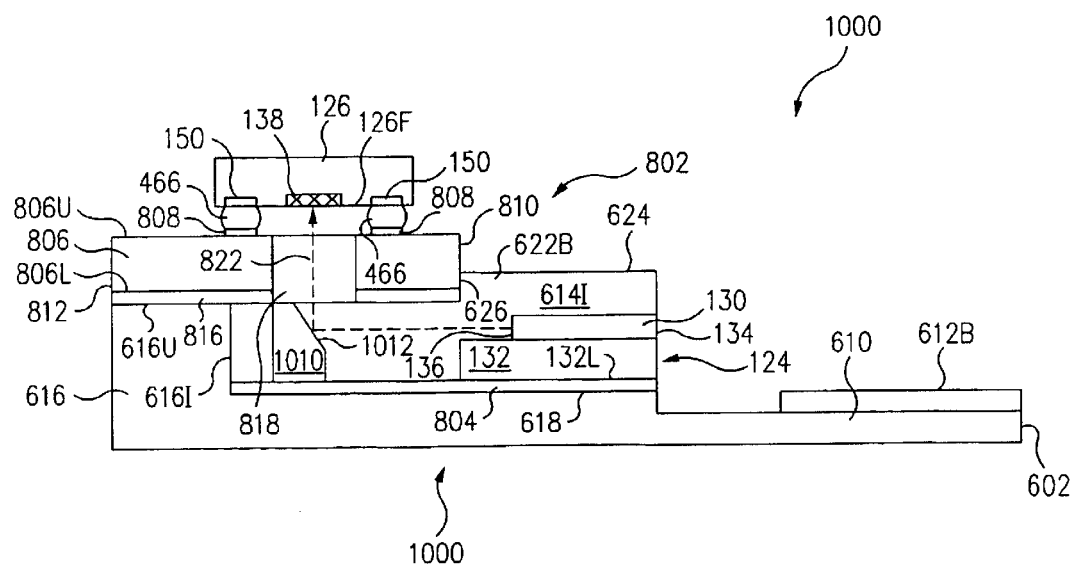
FIG. 10 is a cross-sectional view of an optical subassembly in accordance with an alternative embodiment of the present invention.

FIG. 10 is a cross-sectional view of an optical subassembly 1000 in accordance with an alternative embodiment of the present invention. Optical subassembly 1000 of FIG. 10 is similar to optical subassembly of FIG. 9 and only the significant differences are discussed below.

Referring now to FIG. 10, optical subassembly 1000 includes a reflector 1010. Reflector 1010 is mounted to laser mounting surface 618 of optical bench 600, for example, with solder 804. Alternatively, instead of being a separate structure, reflector 1010 is integral with optical bench 600.

Reflector 1010 is located directly below and aligned with photodiode aperture 818 and active area 138 of photodiode 126. Reflector 1010 includes a reflective surface 1012. Reflective surface 1012 is angled with respect to front surface 126F of photodiode 126. During use, light 822 emanating from rear facet 136 of laser diode 130 strikes reflective surface 1012. Light 822 is reflected up onto active area 138 of photodiode 126.

In a manner similar to that discussed above with regards to reflective surface 820 of FIG. 7, to prevent light 822 from being reflected back from photodiode 126 to rear facet 136 of laser diode 130, reflective surface 1012 is angled with respect to a line from photodiode 126 to laser diode 130. Thus, light 822 from rear facet 136 is reflected by reflective surface 1012 to photodiode 126 and not vice versa.

Figure 11:
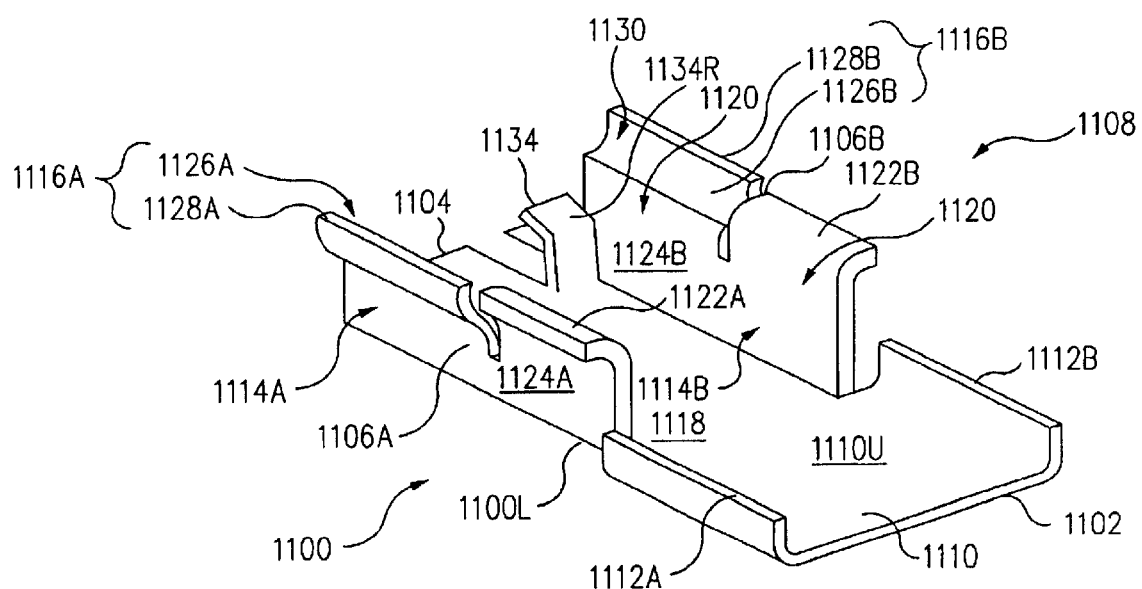
FIGS. 11 and 12 are perspective and top plan views of an optical bench in accordance with one embodiment of the present invention.
Figure 12:
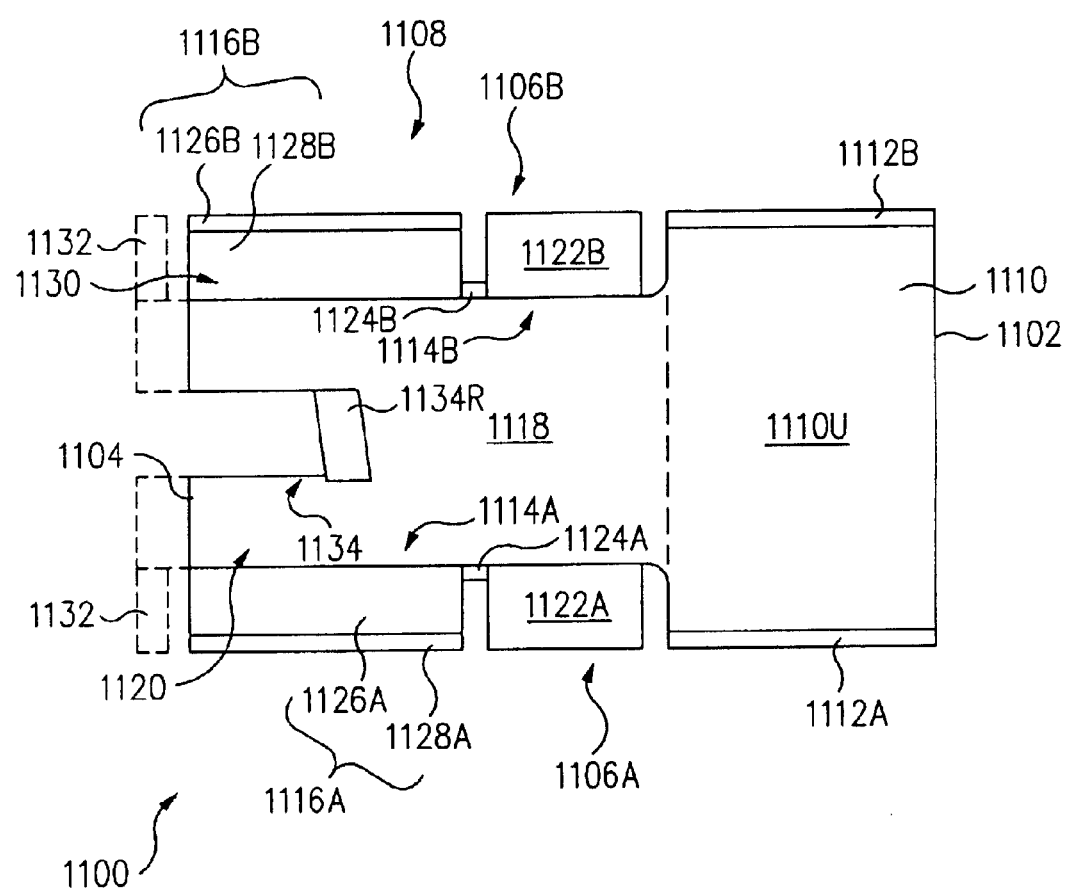

FIGS. 11 and 12 are perspective and top plan views of an optical bench 1100 in accordance with one embodiment of the present invention. Referring now to FIGS. 11 and 12 together, optical bench 1100 includes a leading side 1102, a tailing side 1104, and first and second sides 1106A, 1106B, collectively referred to sides 1106.

Optical bench 1100 is sometimes called a heat sink. In one embodiment, optical bench 1100 is formed at lost cost by stamping a single piece, e.g., of copper or copper tungsten alloy (CuW).

Optical bench 1100 is essentially rectangular as best shown in FIG. 12. More particularly, leading side 1102 is parallel to tailing side 1104 and sides 1106 are parallel to one another. Further, sides 1106 are perpendicular to and extend between leading side 1102 and tailing side 1104.

Optical bench 1100 includes a template plate 1108 and a weld plate support 1110. In one embodiment, optical bench 1100 is integral, i.e., template plate 1108 and weld plate support 1110 are parts of a single piece and are not separate pieces connected together. However, in an alternative embodiment, template plate 1108 and/or weld plate support 1110 are separate pieces connected together.

In this embodiment, template plate 1108 and weld plate support 1110 include a lower, e.g., first, surface 1100L. Weld plate support 1110 includes first and second tabs 1112A, 1112B formed along first and second sides 1106A, 1106B, respectively. In accordance with this embodiment, tabs 1112A, 1112B are rectangular bars but are formed in other shapes in other embodiments.

Tabs 1112A, 1112B project upwards from upper surface 1110U of weld plate support 1110. Tabs 1112A, 1112B facilitate alignment and mounting of a weld plate to optical bench 1100. Alternatively, weld plate support 1110 is used as a weld plate.

Template plate 1108 is a trench shaped member. More particularly, template plate 1108 includes a pair of spaced apart sidewalls 1114A, 1114B, collectively referred to as sidewalls 1114, and a laser diode subassembly mounting plate 1118, hereinafter referred to as laser mounting plate 1118.

Sidewalls 1114A, 1114B are parallel to, extend along and are at sides 1106A, 1106B, respectively. Sidewalls 1114A, 1114B extend along sides 1106A, 1106B from tailing side 1104 to weld plate support 1110. Sidewalls 1114 extend upwards and perpendicularly from laser mounting plate 1118.

Laser mounting plate 1118 and sidewalls 1114 define a trench 1120. Trench 1120 facilitates alignment and mounting of a laser diode subassembly to optical bench 1100 as discussed below in greater detail below in reference to FIG. 13.

Sidewalls 1114A, 1114B include photodiode subassembly mounting flanges 1116A, 1116B, stop flanges 1122A, 1122B, and sidewall bodies 1124A, 1124B, respectively. Photodiode subassembly mounting flanges 1116A, 1116B, stop flanges 1122A, 1122B, and sidewall bodies 1124A, 1124B are collectively referred to as photodiode subassembly mounting flanges 1116, stop flanges 1122, and sidewall bodies 1124, respectively.

Sidewall bodies 1124 are connected to laser mounting plate 1118 along sides 1106. Sidewalls bodies 1124 extend upwards perpendicularly from mounting plate 1118. Photodiode subassembly mounting flanges 1116 and stop flanges 1122 extend outwards from sidewall bodies 1124.

Stop flanges 1122 are located directly adjacent weld plate support 1110 and photodiode subassembly mounting flanges 1116 are located directly adjacent tailing side 1104 of optical bench 1100. Stated another way, stop flanges 1122 are located at the ends of sidewalls 1114, which are nearest leading side 1102 and furthest away from tailing side 1104.

Conversely, photodiode subassembly mounting flanges 1116 are located at the ends of sidewalls 1114, which are furthest away from leading side 1102 and nearest tailing side 1104. Sidewall bodies 1124 extend from tailing side 1104 to weld plate support 1110.

Photodiode subassembly mounting flanges 1116A, 1116B include photodiode subassembly mounting surfaces 1126A, 1126B, respectively. A plane defined by photodiode subassembly mounting surfaces 1126A, 1126B, collectively referred to as photodiode subassembly mounting surfaces 1126, is parallel to laser mounting plate 1118 and perpendicular to sidewall bodies 1124.

Photodiode subassembly mounting flanges 1116A, 1116B further include first and second tabs 1128A, 1128B, respectively. Tabs 1128A, 1128B, collectively referred to as tabs 1128, are parallel to sidewall bodies 1124 and perpendicular to photodiode subassembly mounting surfaces 1126 and laser mounting plate 1118. Tabs 1128 extend upwards from photodiode subassembly mounting surfaces 1126. In accordance with this embodiment, tabs 1128 are rectangular bars but are formed in other shapes in other embodiments.

Photodiode subassembly mounting surfaces 1126, tabs 1128 in combination with stop flanges 1122 define a pocket 1130, which facilitates alignment and mounting of a photodiode subassembly to optical bench 1100 as discussed below in greater detail below in reference to FIG. 13.

In one embodiment, optical bench 1100 further includes rear stop flanges 1132, as indicated in dashed lines in FIG. 12. Rear stop flanges 1132 are similar to stop flanges 1122. However, rear stop flanges 1132 are formed at tailing side 1104 of optical bench 1100. Rear stop flanges 1132 further define pocket 1130.

A reflector 1134 includes a reflective surface 1134R. Reflector 1134 extends upwards from laser mounting plate 1118 and is located within trench 1120. In a manner similar to that described above in reference to reflective surface 820 of FIG. 9, during use, light emanating from rear facet 136 of laser diode 130 (FIG. 9) strikes reflective surface 1134R. This light is reflected up onto active area 138 of photodiode 126.

Figure 13:
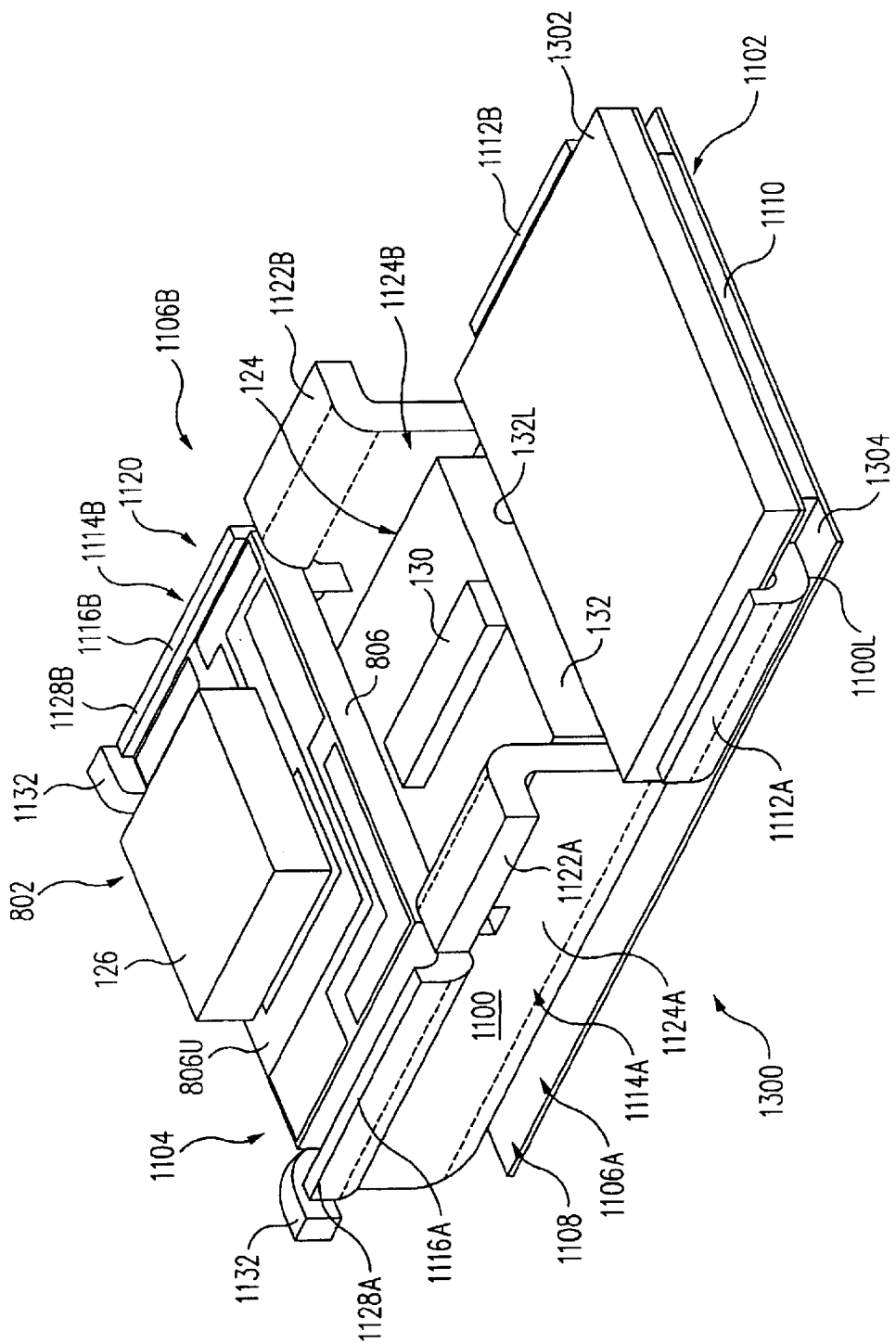
FIG. 13 is a perspective view of an optical subassembly formed with the optical bench of FIG. 11 in accordance with one embodiment of the present invention.

FIG. 13 is a perspective view of an optical subassembly 1300 formed with optical bench 1100 of FIG. 11 in accordance with one embodiment of the present invention. Optical subassembly 1300 of FIG. 13 is similar in various aspects to optical subassembly 800 of FIGS. 8 and 9. Accordingly, similar elements are labeled with similar reference numbers and the discussion above regarding these similar elements is incorporated herein as applied to optical subassembly 1300.

Referring now to FIGS. 11, 12, and 13 together, optical subassembly 1300 includes laser diode subassembly 124 and photodiode subassembly 802 mounted to optical bench 1100. More particular, lower surface 132L of laser diode substrate 132 of laser diode subassembly 124 is mounted to laser mounting plate 1118, e.g., with solder. In this manner, laser diode subassembly 124 is located within trench 1120.

To allow laser diode subassembly 124 to fit within trench 1120, a width of trench 1120 is slightly greater than the width of laser diode subassembly 124, and, more particularly, laser diode substrate 132. However, by forming the width of trench 1120, i.e., the distance between sidewall bodies 1124 of sidewalls 1114, to be only slightly greater than the width of laser diode substrate 132, laser diode subassembly 124 is positioned with respect to optical bench 1100 to within tight tolerance.

Further, a height of sidewall bodies 1124, i.e., the distance between photodiode subassembly mounting surfaces 1126 and laser mounting plate 1118, is greater than the thickness of laser diode subassembly 124, i.e., the combined thickness of laser diode 130 and laser diode substrate 132.

Photodiode subassembly 802 includes photodiode 126 flip chip mounted to upper surface 806U of photodiode substrate 806. By flip chip mounting photodiode 126 to photodiode substrate 806, photodiode 126 is positioned with respect to photodiode substrate 806 to within tight tolerance.

As discussed above in reference to FIGS. 11 and 12, photodiode subassembly mounting surfaces 1126, tabs 1128, stop flanges 1122 and rear stop flanges 1132 define a pocket 1130. Photodiode substrate 806 is shaped to fit snugly within pocket 1130 in a lock and key arrangement.

More particularly, lower surface 806L of photodiode substrate 806 is mounted to photodiode subassembly mounting surfaces 1126, for example, with solder, sometimes called a solder preform. Photodiode substrate 806 is mounted such that leading side 810 of photodiode substrate 806 is in abutting contact or directly adjacent stop flanges 1122. Further, sides 814A, 814B of photodiode substrate 806 are in abutting contact or directly adjacent tabs 1128A, 1128B, respectively. In addition, photodiode substrate 806 is mounted such that tailing side 812 of photodiode substrate 806 is in abutting contact or directly adjacent rear stop flanges 1132.

By mounting photodiode substrate 806 within pocket 1130, photodiode substrate 806 and thus photodiode 126 is positioned with respect to optical bench 1100 to within tight tolerance. As discussed above, laser diode subassembly 124 and thus laser diode 130 are also positioned with respect to optical bench 1100 to within tight tolerance. As a result, photodiode 126 positioned with respect to laser diode 130 to within tight tolerance.

Reflective surface 1134R (FIGS. 11, 12) is angled with respect to front surface 126F of photodiode 126. During use, light emanating from rear facet 136 of laser diode 130 strikes reflective surface 1134R. The light is reflected up onto the active area of photodiode 126 through photodiode aperture 818 of photodiode substrate 806 (see FIG. 9 for example).

In one embodiment, by monitoring the light output from rear facet 136 of laser diode 130 with photodiode 126 as discussed above, the power input to laser diode 130 is continuously adjusted to provide a constant power output from front facet 134.

In a manner similar to that discussed above with regards to FIGS. 1 and 2 together, to prevent light from being reflected back from photodiode 126 to rear facet 136 of laser diode 130, reflective surface 1134R is angled with respect to a line from photodiode 126 to laser diode 130. Thus, light from rear facet 136 is reflected by reflective surface 1134R to photodiode 126 and not vice versa.

During use, photodiode 126 and laser diode 130 generate heat. This heat is conducted directly to optical bench 1100 through photodiode substrate 806, laser diode substrate 132 and the solders which mount photodiode substrate 806, laser diode substrate 132 to optical bench 1100. This insures that photodiode 126 and laser diode 130 are not overheated.

Optical subassembly 1300 further includes a weld plate 1302 mounted to weld plate support 1110. Tabs 1112 facilitate positioning of weld plate 1302. Further, a solder 1304, sometimes called a solder preform, is illustrated adjacent lower surface 1100L of optical bench 1100.

Figure 14:
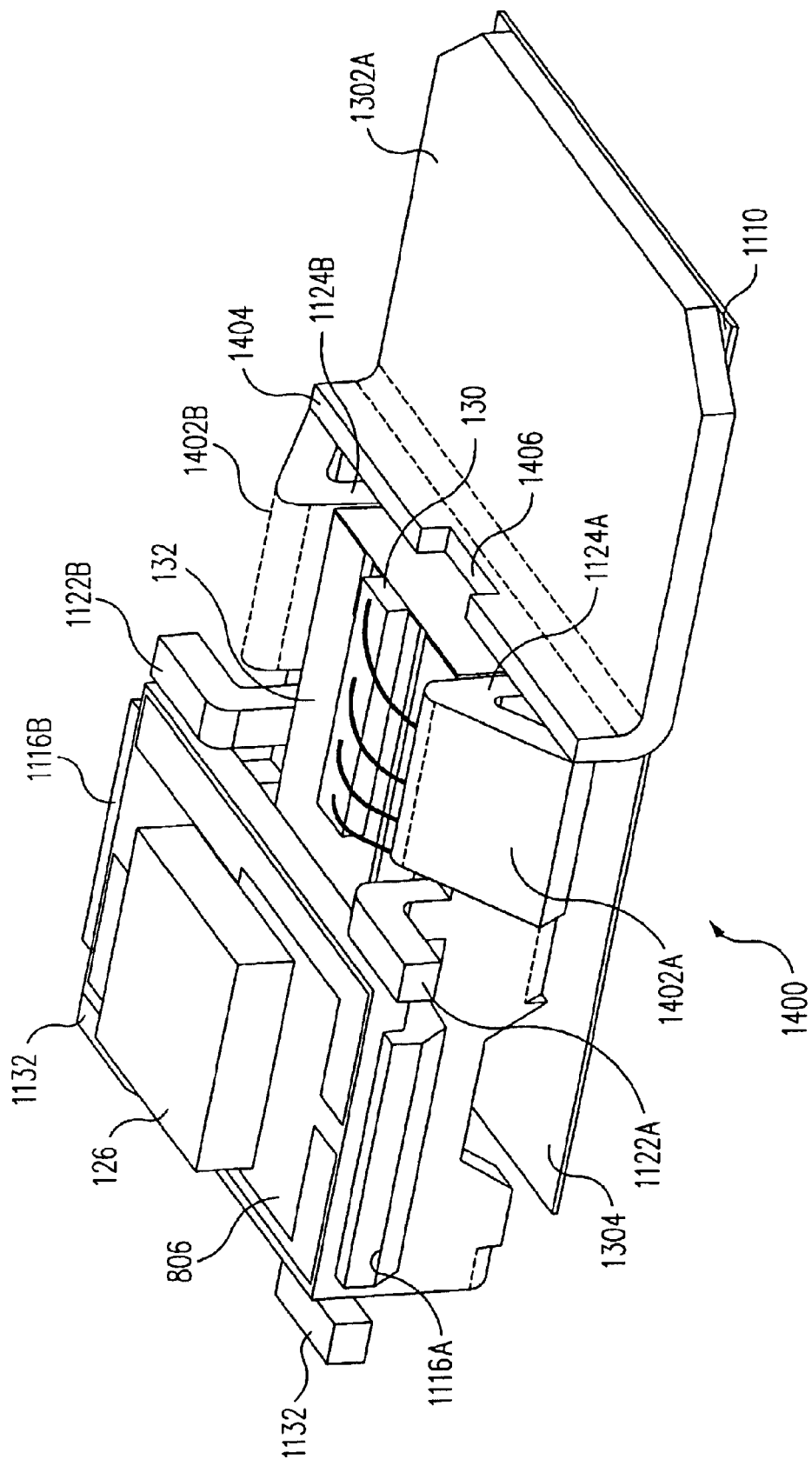
FIG. 14 is a perspective view of an optical subassembly in accordance with an alternative embodiment of the present invention.

FIG. 14 is a perspective view of an optical subassembly 1400 in accordance with an alternative embodiment of the present invention. Optical subassembly 1400 of FIG. 14 is similar to optical subassembly 1300 of FIG. 13 and only the significant differences are discussed below.

In accordance with this embodiment, stop flanges 1122 do not extend all the way to weld plate support 1110 but are only located directly adjacent photodiode subassembly mounting flanges 1116. Between stop flanges 1122 and weld plate support 1110 are wirebond flanges 1402A, 1402B, collectively referred to as wirebond flanges 1402.

Wirebond flanges 1402 are bent downwards and away from sidewall bodies 1124. As discussed in greater detail with reference to FIG. 15, bond wires from laser diode substrate 132 pass over wirebond flanges 1402 to terminals of the optical subassembly enclosure. Since wirebond flanges 1402 are bent downwards, the length of the bond wires is minimized. In one embodiment, wirebond flanges 1402 are nonconductive or include an electrical insulator to prevent shorting of the bond wires on wirebond flanges 1402.

Further, optical subassembly 1400 is formed with a weld plate support 1110 having an absence of tabs. Further, weld plate 1302A includes a lip 1404 including an alignment notch 1406. Alignment notch 1406 facilitate positioning of the optical fiber relative to laser diode 130.

Figure 15:
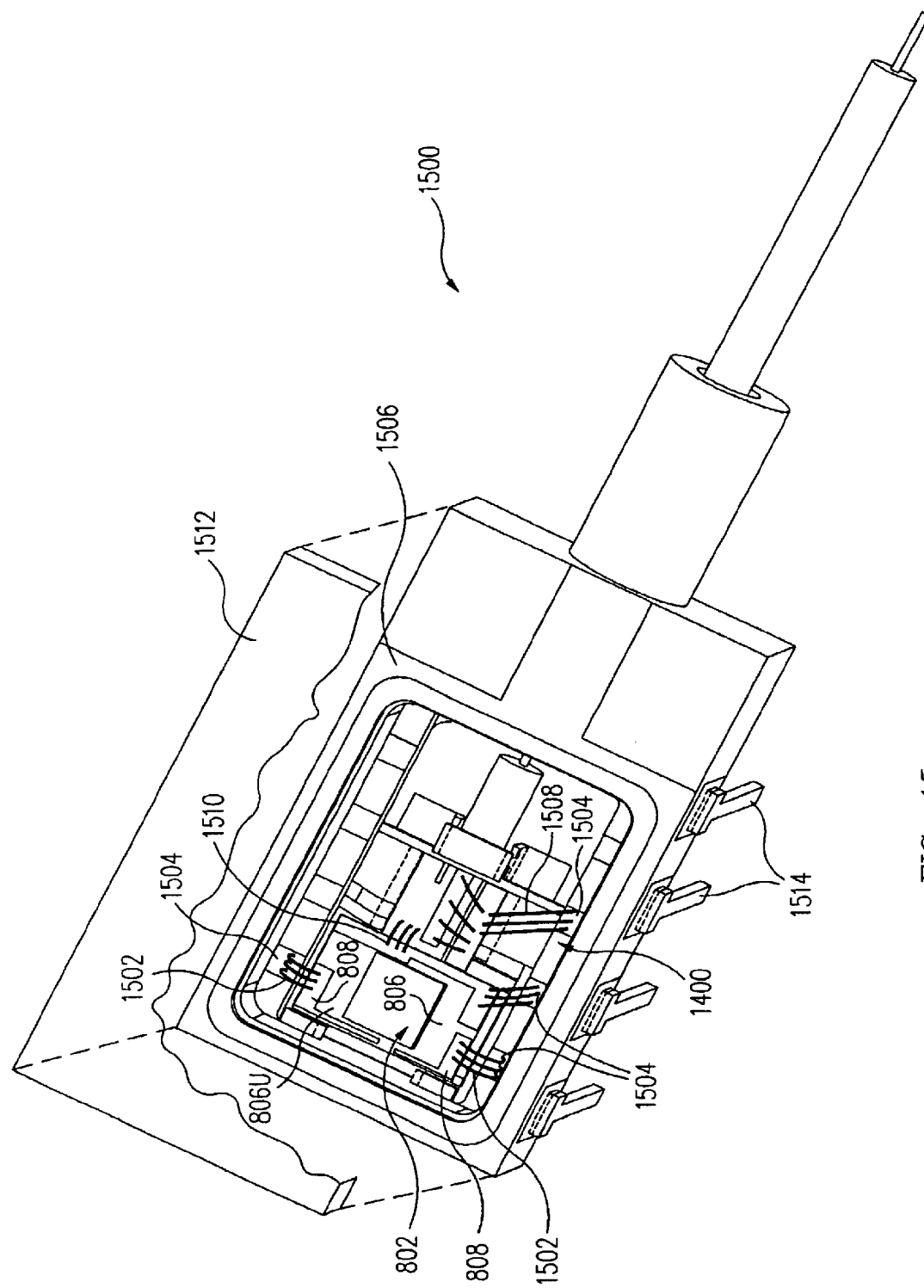
FIG. 15 is an exploded perspective view of a laser module formed with the optical subassembly of FIG. 14 in accordance with one embodiment of the present invention.

FIG. 15 is an exploded perspective view of a laser module 1500 formed with optical subassembly 1400 of FIG. 14 in accordance with one embodiment of the present invention. Illustratively, optical subassembly 1400 is mounted to an optical subassembly enclosure 1506 with solder 1304 (FIG. 14).

As shown in FIG. 15, bond wires 1502 electrically connect traces 808 on upper surface 806U of photodiode substrate 806 to terminals 1504 of an optical subassembly enclosure 1506.

Further, bond wires 1508 electrically connect traces (see traces 146 of FIG. 8 for example) on upper surface 132U of laser diode substrate 132 to terminals 1504 of optical subassembly enclosure 1506. Further, bond wires 1510 electrically connect traces 808 on upper surface 132U of laser diode substrate 132 to traces on upper surface 806U of photodiode substrate 806.

Optical subassembly 1400 is sealed within optical subassembly enclosure 1506 with a lid 1512. Terminals 1504 are electrically connected to leads 1514. Although a particular laser module 1500 is illustrated in FIG. 15, in light of this disclosure, those of skill in the art will understand that optical subassembly 1400 can be incorporated into a wide variety of different module styles, e.g., BGA, LGA, LCC or leadframe.

Figure 16:
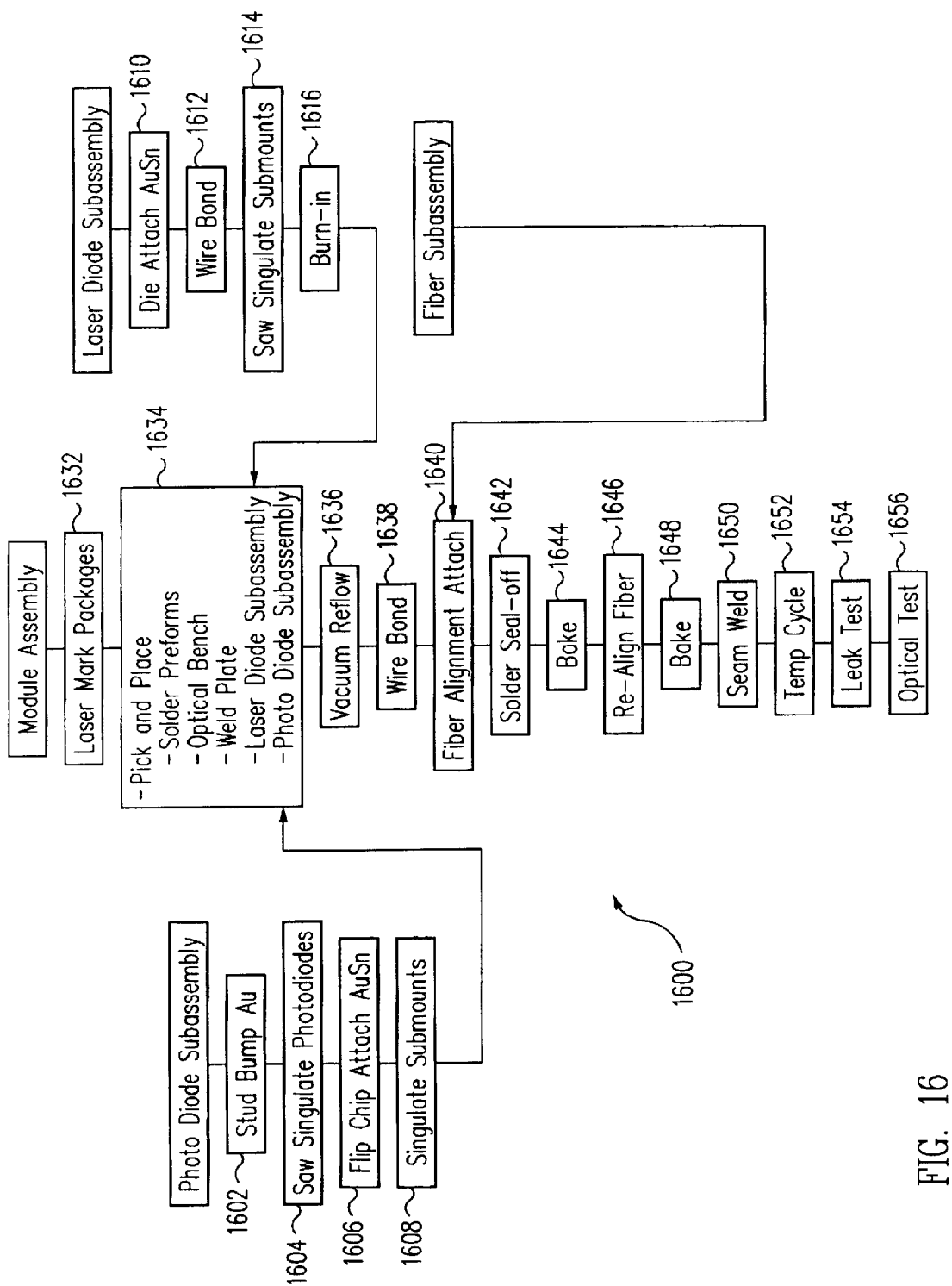
FIG. 16 is a process flow diagram for forming the laser module of FIG. 15 in accordance with one embodiment of the present invention.

FIG. 16 is a process flow diagram 1600 for forming laser module 1500 of FIG. 15 in accordance with one embodiment of the present invention. Referring now to FIGS. 15 and 16 together, to form photodiode subassembly 802, integrally connected photodiodes are stud bumped, for example with gold, in a stud bump operation 1602. The photodiodes are saw singulated in a saw singulate photodiodes operation 1604.

Photodiode 126 is flip chip mounted to photodiode substrate 806, which is integrally connected to a plurality of photodiode substrates, in a flip chip attach operation 1606. Illustratively, photodiode 126 is flip chip mounted using gold tin alloy flip chip bumps. Photodiode substrate 806 is singulated to complete fabrication of photodiode subassembly 802 in a singulated submounts operation 1608.

To form laser diode subassembly 124, laser diode 130 is mounted to laser diode substrate 132, which is integrally connected to a plurality of laser diode substrates, in a die attach operation 1610. For example, laser diode 130 is mounted using gold tin alloy. Terminals 156 of laser diode 130 are wirebond to traces 146 of laser diode substrate 132 in a wirebond operation 1612. Laser diode substrate 132 is singulated to complete fabrication of laser diode subassembly 124 in a saw singulate submounts operation 1614. Laser diode subassembly 124 is heated for reliability in a burn-in operation 1616.

To assemble laser module 1500, optical subassembly enclosure 1506 is marked in a laser mark packages operation 1632. In a pick and place operation 1634, solder preforms (corresponding to solders 1304, 804, 816 and a solder perform on weld plate support 1110), optical bench 1100, weld plate 1302A, laser diode subassembly 124, and photodiode subassembly 802 are placed within optical subassembly enclosure 1506.

In a vacuum reflow operation 1636, optical subassembly enclosure 1506 including the solder performs, optical bench 1100, weld plate 1302A, laser diode subassembly 124, and photodiode subassembly 802 are heated in vacuum to reflow the solder preforms. This mounts optical subassembly enclosure 1506, optical bench 1100, weld plate 1302A, laser diode subassembly 124, and photodiode subassembly 802 together.

In a wirebond operation 1638, bond wires 1502, 1508 and 1510 are formed. In a fiber alignment/attach operation 1640, the fiber subassembly is aligned and attached to weld plate 1302A. In a solder seal-off operation 1642, solder is used to hermetically seal the optical fiber exit port. In a bake operation 1644, the assembly is heated. In a realign fiber operation 1646, the fiber subassembly is re-aligned to compensate for any change in alignment, which occurred during bake operation 1644. The assembly is again heated in a bake operation 1648.

In a seam weld operation 1650, lid 1512 is mounted to optical subassembly enclosure 1506 to seal and protect optical subassembly 1400. In a temperature cycle operation 1652, laser module 1500 is repeatedly heated and tested for reliability purposes. In a leak test operation 1654, the integrity of the seal around optical subassembly 1400 is tested. In an optical test operation 1656, the optical performance of laser module 1500 is tested.

This disclosure provides exemplary embodiments of the present invention. The scope of the present invention is not limited by these exemplary embodiments. Numerous variations, whether explicitly provided for by the specification or implied by the specification or not, such as variations in structure, dimension, type of material and manufacturing process may be implemented by one of skill in the art in view of this disclosure.

What is claimed is:

1. A structure comprising:
   an alignment plate comprising:
      a template plate comprising a laser diode aperture and a photodiode aperture;
      a weld plate coupled to said template plate; and
      a reflector coupled to said template plate.

2. The structure of claim 1 further comprising a heat sink coupled to said alignment plate.

3. The structure of claim 2 further comprising a photodiode subassembly mounted within said photodiode aperture and to said heat sink.

4. The structure of claim 3 further comprising a laser diode subassembly mounted within said laser diode aperture and to said heat sink.

5. The structure of claim 4 wherein said alignment plate, said photodiode subassembly, and said laser diode subassembly are mounted to a first surface of said heat sink with a solder.

6. The structure of claim 1 further comprising an optical fiber coupled to said weld plate.

7. The structure of claim 1 wherein said reflector comprises a reflective surface.

8. A structure comprising:
   a heat sink comprising:
      a template plate; and
      a weld plate coupled to said template plate,
   a photodiode subassembly coupled to said template plate, said photodiode subassembly comprising a photodiode substrate comprising a pair of spaced apart parallel fingers defining a slot; and
   a laser diode subassembly coupled to said template plate and located within said slot.

9. The structure of claim 8 wherein said photodiode subassembly further comprises a photodiode flip chip mounted to said photodiode substrate.

10. The structure of claim 9 further comprising a reflector coupled to said template plate and located within said slot directly below said photodiode.

11. A structure comprising:
    a template plate coupled to a weld plate, said template plate comprising:
       a main body;
       a pair of spaced apart parallel fingers extending from said main body; and
       a laser mounting surface contiguous with an inner side of said main body and inner sides of said pair of spaced apart parallel fingers, said inner side of said main body comprising a reflective surface.

12. The structure of claim 11 wherein said template plate further comprises stops located at tips of said pair of spaced apart parallel fingers.

13. The structure of claim 12 wherein said main body comprises an upper surface, said stops comprising:
    raised surfaces; and
    stops surfaces perpendicular to and extending between said upper surface of said main body and said raised surfaces of said stops.

14. The structure of claim 13 further comprising tabs projecting upwards from said upper surface of said main body.

15. The structure of claim 14 wherein said tabs in combination with said stops define a pocket.

16. The structure of claim 15 further comprising a photodiode subassembly coupled to said template plate within said pocket.

17. The structure of claim 16 wherein said photodiode subassembly comprises:
    a photodiode substrate; and
    a photodiode flip chip mounted to said photodiode substrate.

18. The structure of claim 17 wherein said photodiode substrate comprises a lower surface coupled to said upper surface of said main body.

19. The structure of claim 17 wherein said photodiode substrate comprises a photodiode aperture directly below and aligned with an active area of said photodiode.

20. The structure of claim 19 wherein said reflective surface is directly below and aligned with said photodiode aperture.

21. The structure of claim 11 wherein said inner side of said main body and said inner sides of said pair of spaced apart parallel fingers define a trench, said structure further comprising a laser diode subassembly coupled to said laser mounting surface and located within said trench.

22. A structure comprising:
a template plate coupled to a weld plate, said template plate comprising:
a main body;
a pair of spaced apart parallel fingers extending from said main body; and
a laser mounting surface contiguous with an inner side of said main body and inner sides of said pair of spaced apart parallel fingers;
a photodiode subassembly coupled to said template plate, said photodiode subassembly comprising:
a photodiode substrate; and
a photodiode flip chip mounted to said photodiode substrate, said photodiode substrate comprising a photodiode aperture directly below and aligned with an active area of said photodiode; and
a reflector coupled to said laser mounting surface, said reflector being located directly below and aligned with said photodiode aperture.

23. A structure comprising:
an alignment plate comprising:
a template plate comprising a laser diode aperture and a photodiode aperture;
a weld plate coupled to said template plate; and
a reflector coupled to said template plate;
a photodiode subassembly mounted within said photodiode aperture; and
a laser diode subassembly mounted within said laser diode aperture.

24. The structure of claim 23 further comprising a heat sink coupled to said alignment plate.

25. The structure of claim 24 wherein said photodiode subassembly is mounted to said heat sink.

26. The structure of claim 24 wherein said laser diode subassembly is mounted to said heat sink.

27. The structure of claim 24 wherein said alignment plate is mounted to a first surface of said heat sink with a solder.

28. The structure of claim 23 further comprising an optical fiber coupled to said weld plate.

29. A structure comprising:
a template plate comprising:
a main body;
a pair of spaced apart parallel fingers extending from said main body; and
a laser mounting surface contiguous with an inner side of said main body and inner sides of said pair of spaced apart parallel fingers;
a photodiode subassembly coupled to said template plate, said photodiode subassembly comprising a photodiode;
a reflector coupled to said laser mounting surface, said reflector being located directly below and aligned with said photodiode; and
a laser diode subassembly located within a slot defined by said inner side of said main body and said inner sides of said pair of spaced apart parallel fingers.

* * * * *